(12) United States Patent
Nakatsuka et al.

(10) Patent No.: US 7,653,110 B2
(45) Date of Patent: Jan. 26, 2010

(54) SEMICONDUCTOR LASER APPARATUS AND METHOD FOR MOUNTING SEMICONDUCTOR LASER APPARATUS

(75) Inventors: Shinichi Nakatsuka, Tokyo (JP); Tsukuru Ootoshi, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 77 days.

(21) Appl. No.: 12/149,040

(22) Filed: Apr. 25, 2008

(65) Prior Publication Data

US 2008/0279246 A1 Nov. 13, 2008

(30) Foreign Application Priority Data

Apr. 27, 2007 (JP) ............................ P2007-117997

(51) Int. Cl.
*H01S 3/00* (2006.01)
*H01S 5/00* (2006.01)
(52) U.S. Cl. .................. 372/50.12; 372/33; 372/50.122
(58) Field of Classification Search .................. 372/33, 372/46.014, 46.015, 50.12, 50.122
See application file for complete search history.

(56) References Cited

FOREIGN PATENT DOCUMENTS

JP 2004-14659 1/2004

OTHER PUBLICATIONS

I. Yoshida et al., "Closely Spaced Independently Addressable Dual-Beam Visible Lasers with Strained GaInP Quantum Wells" Jpn. J. Appl. Phys. Vo. 34 (1995) pp. 4803.
R. Geel et al., "Dual Spot Visible Laser Diodes" Electron. Lett. Vo. 28 (1992) pp. 1420.

*Primary Examiner*—Armando Rodriguez
(74) *Attorney, Agent, or Firm*—McGinn IP Law Group, PLLC (57) ABSTRACT

According to an aspect of the present invention, there is provided a semiconductor laser apparatus including: a laser device including: a semiconductor substrate, first and second resonators formed on the semiconductor substrate, and first and second electrodes that are respectively connected with the first and the second resonators and extend away from each other; and a submount including: third and fourth electrodes respectively adhered with the first and the second electrodes; wherein each of the first and the second electrodes includes: an energizing portion covering the corresponding resonator, an adhering portion being disposed separately from the energizing portion and having a height larger than that of the energizing portion, and a stress-absorbing portion formed in the adhering portion.

12 Claims, 7 Drawing Sheets

SOLDER SPACE WIDTH FROM CENTER (μm)

SEMICONDUCTOR LASER APPARATUS AND METHOD FOR MOUNTING SEMICONDUCTOR LASER APPARATUS

CROSS-REFERENCE TO RELATED APPLICATIONS

The entire disclosure of Japanese Patent Application No. 2007-117997 filed on Apr. 27, 2007 including specification, claims, drawings and abstract is incorporated herein by reference in its entirety.

BACKGROUND OF THE INVENTION

1. Field of the Invention

An aspect of the present invention relates to a semiconductor laser apparatus and a method for mounting a semiconductor laser apparatus, particularly to an array-type semiconductor laser apparatus, more particularly to a semiconductor laser light source to be used in a laser beam printer or a laser-type copying machine, and especially to an array-type semiconductor laser, in which a plurality of light emitting points are arrayed at a narrow spacing of 50 μm or less between laser light sources.

2. Description of the Related Art

In a laser beam printer, the printing speed can be increased in proportion to the number of the simultaneous beams. For example, an array-type semiconductor laser having a structure, as shown in FIG. 11, may be used.

Figure 11:
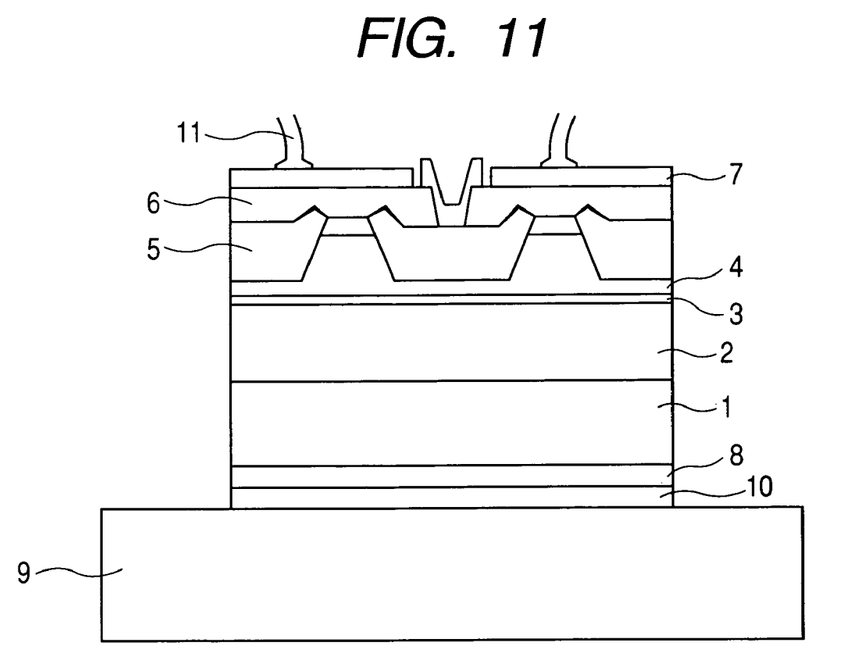
FIG. 11 shows an exemplary laser structure.

In FIG. 11: numeral 1 designates an n-type GaAs substrate on which a double hetero-structure constituting a semiconductor laser is grown through the epitaxial crystal growth; numeral 2 an n-type cladding layer formed over the substrate 1 and made of AlGaInP; numeral 3 an active layer made of AlGaInP; numeral 4 a cladding layer made of p-type AlGaInP; numeral 5 a current blocking (block) layer made of n-type GaAs; and numeral 6 a contact layer. The mixed crystal composition ratio is set so that the energy gap of the AlGaInP active layer 3 may have an energy gap smaller than those of the AlGaInP cladding layers 2 and 4, thereby constituting a double hetero-structure. The semiconductor laser is required to make single-mode oscillations for the application, in which a laser beam for a printer is focused by using an optical system. In order to attain single-mode oscillations and to reduce an electric current necessary for the laser oscillations, a p-type AlGaInP layer 4 is selectively etched to form a ridge while leaving its stripe portion, and the current blocking (block) layer 5 is selectively grown by using of an amorphous film such as SiNx. As a result, only the portion having the ridge becomes a conductive region thereby forming a stripe waveguide 113. If this structure is cleaved to form a reflecting mirror, it forms an optical resonator between itself and the stripe waveguide which makes an optical gain when energized, thereby forming a facet light-emitting laser structure. After the SiNx film is removed, the GaAs contact 6 is crystally grown to form a laser chip having a p-electrode 7 and an n-electrode 8. In the case of an array laser, as shown in FIG. 11, a plurality of stripe waveguides 113 are formed in the single chip, and the p-electrode 7 is separately provided to correspond to each of the stripe waveguides 113.

The laser chip is fixed on a submount 9 made of AlN or SiC having a large thermal conductivity coefficient by soldering, as indicated by 10, the electrodes of the laser chip. In the semiconductor laser element having only the single light-emitting region, the laser chip is fixed to the submount so that the face (corresponding to the face of the upper side of FIG. 11) on which the epitaxial growth is performed of the laser chip is adhered to the submount surface. This assembly mode is generally called the "downward junction-face assembly, because the face having the p-n junction of the laser chip mounted over the submount is positioned on the lower side of the chip. With this constitution, the heat, which is generated in the p-n junction in the epitaxial grown film, is efficiently dissipated to the submount made of an insulator of a high thermal conductivity.

In the array laser, too, the downward junction-face assembly is desired, if only the heat dissipation is considered. In the array-type laser required to have the electric insulation between the elements, however, the downward junction-face assembly is liable to invite the short-circuiting between the elements, thereby causing a problem that the mass productivity is poor. Therefore, this array laser is generally mounted in the upward junction-face assembly, in which the back-face electrode (corresponding to the n-electrode 8 of FIG. 11) of the laser chip is soldered to the submount. In this case, the energization of the surface electrode (corresponding to the p-electrode 7 of FIG. 11) is realized by boding a gold wire 11 to each of the divided electrodes (for example, I. "Yoshida et al., Jpn. J. Appl. Phys. Vo. 34 (1995) pp. 4803" and "R. Geel et al., Electron. Lett. Vo. 28 (1992) pp. 1420").

Figure 12:
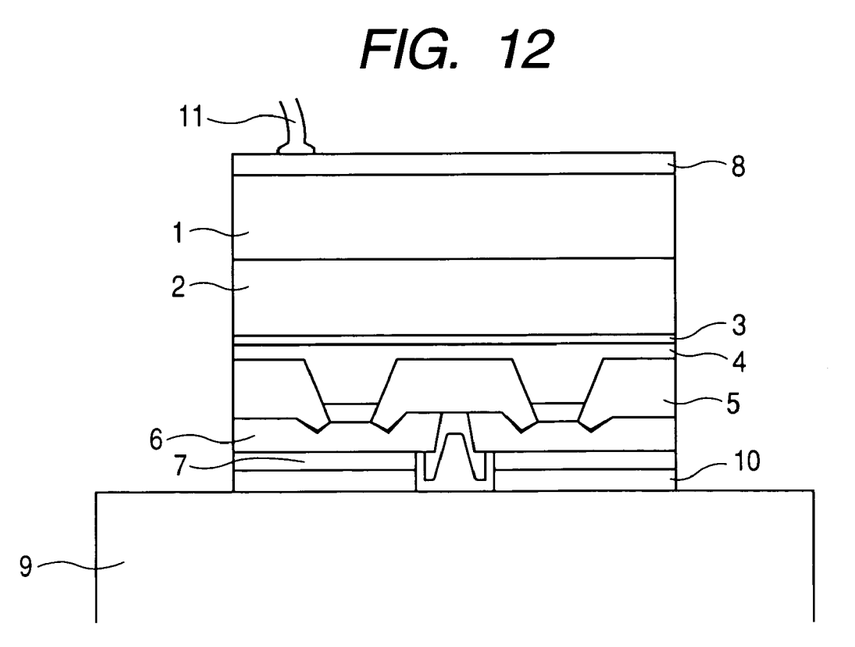
FIG. 12 shows an exemplary laser structure.

For necessities of the high image quality, the high speed and the small size of a laser printer, however, there is further desired a laser element having more-stable optical output at a high temperature. For satisfying the desire, the necessity for adopting the downward junction-face assembly is rising. In case the spacing of the array lasers is wide, the problem of a short-circuiting is hard to arise, so that the laser chip can be assembled with the junction face being downward, as shown in FIG. 12.

In case the spacing of the array lasers is narrow (as specified by about 50 μm or less, for example), the production yield drops due to the occurrence of the short-circuiting. Due to the thermal expansion coefficient difference between the submount and the semiconductor chip, moreover, a stress occurs in the element in the cooling procedure from the solder solidification to the room temperature, thereby causing problems in the reliability of the semiconductor laser or the instability of the oscillating wavelength.

JP-2004-14659-A discloses a method for preventing the influences of the stress in the element having the single light emitting region. An exemplary structure is shown in FIG. 13.

Figure 13:
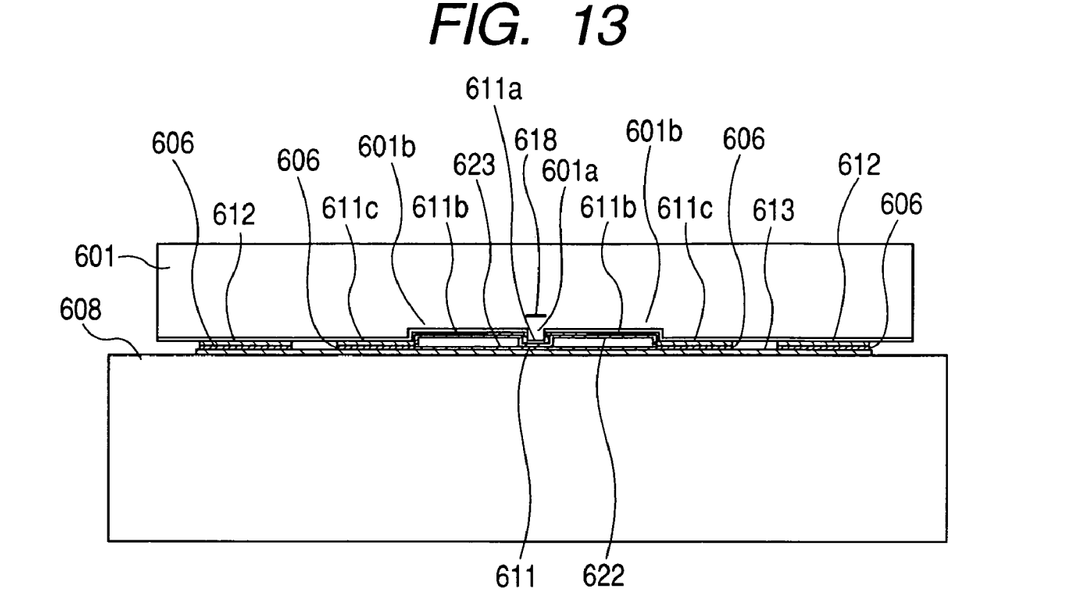
FIG. 13 shows an exemplary laser structure.

In FIG. 13, 601 designates a semiconductor laser element; 601a designates a ridge structure portion; 601b designates a recessed portion; 606 designates a solder layer; 608 designates a mounting substrate; 611 and 612 designate element-side electrode films; 611a designates an electrode film of the ridge structure portion 601a; 611b designates an electrode film of the recessed portion 601b; 611c designates an electrode film of a horizontal portion; 613 designates a board-side electrode film; 618 designates an active layer; 622 designates an element-side solder wet suppressing film; and 623 designates a board-side solder wet suppressing film.

According to a structure shown in FIG. 13, the vicinity of the stripe waveguide is not fixed with a solder but only the region spaced properly from the stripe waveguide (that is, the portion spaced at a proper distance from a region of the active layer of the laser) is fixed by the solder to the submount.

Figure 14:
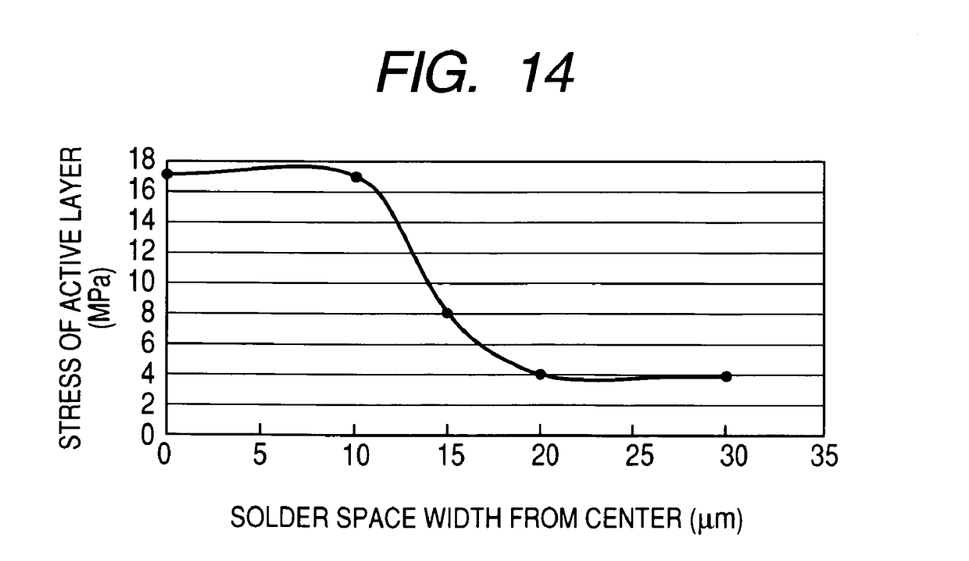
FIG. 14 shows the calculation results of a distance from a soldering position of a semiconductor laser and a stress.

According to JP-2004-14659-A, the stress at the time of mounting the semiconductor laser into the submount exerts adverse influences upon the laser light emission of the laser element, if the laser element is fixed in the region within about 20 μm from the junction portion of the solder, as shown in FIG. 14, because the stress of the active layer increases in that region. Therefore, the junction portion is soldered at a position spaced by more than 20 μm. Thus, it is disclosed that the influences of the junction stress on the stripe waveguide 113 can be reduced, and that the heat can also be dissipated from the laser element by making use of the thermal conduction by the electrode.

As described hereinbefore, the problem that the stress occurs in the downward junction face assembly in the cooling procedure from the solder solidifying temperature to the room temperature due to the thermal expansion coefficient difference between the submount and the semiconductor substrate, thereby degrading the reliability of the semiconductor laser and the stability of the oscillation wavelength can be solved by setting the distance from the stripe waveguide (as designated by numeral 113 in FIG. 1) to the region (as designated by numeral 129 in FIG. 1) fixed by soldering on the submount, to 20 μm or more (or far more, if possible). According to JP-2004-14659-A, this case raises no problem in the heat dissipation, because of the presence of a thermal conduction by the surface electrode.

In the array-type semiconductor laser for the laser printer, however, the temperature of the stripe waveguide 113 is raised by the Joule's heat accompanying the energization so that the phenomenon, as called the "droop", for the optical output to decrease for a while raises a problem. In this phenomenon, the temperature of the stripe waveguide 113 rises to increase the threshold current of the semiconductor laser, so that the laser output drops even in the state of a drive in a constant current. The stable optical output is required from a low output to a high output (from 1 mW to 20 mW, for example) thereby raising a serious problem in a printer array laser, in which a plurality of exothermic regions are present in a common chip. This problem makes it necessary to suppress the distance from the aforementioned stripe waveguide 113 to the region 129 fixed on the submount by the solder, to at least 10 μm or less. Thus, it is difficult to solve the problem by the proposal in JP-2004-14659-A.

SUMMARY OF THE INVENTION

According to an aspect of the present invention, there is provided a semiconductor laser apparatus including: a laser device including: a semiconductor substrate, first and second resonators that are formed on the semiconductor substrate, extend in parallel with each other and are electrically separated from each other, and first and second electrodes that are each electrically connected with corresponding one of the first and the second resonators and extend away from each other; and a submount including: third and fourth electrodes that are electrically separated from each other and are each adhered with corresponding one of the first and the second electrodes by a solder member; wherein each of the first and the second electrodes includes: an energizing portion that covers corresponding one of the first and the second resonators, an adhering portion that is disposed separately from the energizing portion, the adhering portion having a height from a surface of the semiconductor substrate larger than that of the energizing portion, and a stress-absorbing portion that is formed in the adhering portion.

According to another aspect of the present invention, there is provided a method for mounting a semiconductor laser apparatus, including: preparing a laser device including: a semiconductor substrate, first and second resonators that are formed on the semiconductor substrate, extend in parallel with each other and are electrically separated from each other, and first and second electrodes that are each electrically connected with corresponding one of the first and the second resonators and extend away from each other; preparing a submount including: third and fourth electrodes that are electrically separated from each other; and adhering the first electrode to the third electrode and the second electrode to the fourth electrode by a solder member; wherein each of the first and the second electrodes includes: an energizing portion that covers corresponding one of the first and the second resonators, an adhering portion that is disposed separately from the energizing portion, the adhering portion having a height from a surface of the semiconductor substrate larger than that of the energizing portion, and a stress-absorbing portion that is formed in the adhering portion.

BRIEF DESCRIPTION OF THE DRAWINGS

Embodiments of the present invention will be described in detail based on the following figures, wherein.

DETAILED DESCRIPTION OF THE INVENTION

According to an aspect of the present invention, there is provided a technology capable of preventing the adverse influences on the laser characteristics by the stress, while providing the regions 129 to be fixed on the submount by the solder at the aforementioned positions to sufficiently suppress the temperature rise of the stripe waveguides 113 of the aforementioned array laser.

The semiconductor laser is formed by soldering a laser chip 124 and a submount 125. The laser chip 124 includes: an active layer (as designated by reference numeral 106 in FIG. 1) made of a first semiconductor layer and formed over a semiconductor substrate; cladding layers (as designated by reference numerals 102 and 107 in FIG. 1) made of second and third semiconductor layers having conductive-types different from each other and disposed to sandwich the active layer therebetween; a plurality of stripe waveguide structures (as designated by reference numeral 113 in FIG. 1) arranged in parallel on the semiconductor substrate face; and electrodes 116 insulated electrically from each other to feed currents independently to the individual stripe waveguides 113 and arranged in parallel with the stripe waveguides 113. The submount 125 includes: an electrode layer 127 and a solder layer 128 provided in parallel with each electrode 116 of the laser chip 124 to energize each electrode 116 therethrough and to be adhered with the laser chip face on which the laser structure is formed.

In the laser chip 124 of the semiconductor laser, the regions 129 are provided to be fixed on the submount 125 by soldering. In at least portion of the regions 129, the stress absorbing layers 121 is provided for absorbing the stress which is generated in the cooling process from a solder solidifying temperature to the room temperature due to the thermal expansion coefficient difference between the submount and the semiconductor substrate. The stress absorbing layers 121 are provided by forming gaps 120 in the electrodes or by using a metal 202 such as In having a yielding limit stress of 5 MPa or less or an organic material such as a photoresist 301.

If the stress absorbing layers 121 are formed all over the laser chip, there is also provided a stress suppressing effect. However, the heat generated in the stripe waveguide 113 is dissipated through the stress absorbing layers 121 of a poor thermal conductivity. Therefore, in this case, the temperature rise of the stripe waveguide 113 becomes high.

According to an aspect of the present invention, there is provided a semiconductor laser array, which can prevent the stress, as generated in the cooling procedure from the solder solidifying temperature to the room temperature due to the thermal expansion coefficient difference between the submount and the semiconductor substrate when assembling the array-type semiconductor laser, from affecting the stripe waveguide 113 adversely, and which is excellent in the heat dissipation and has a thermal stability in the optical output for enduring its use as a printer light source.

Figure 1:
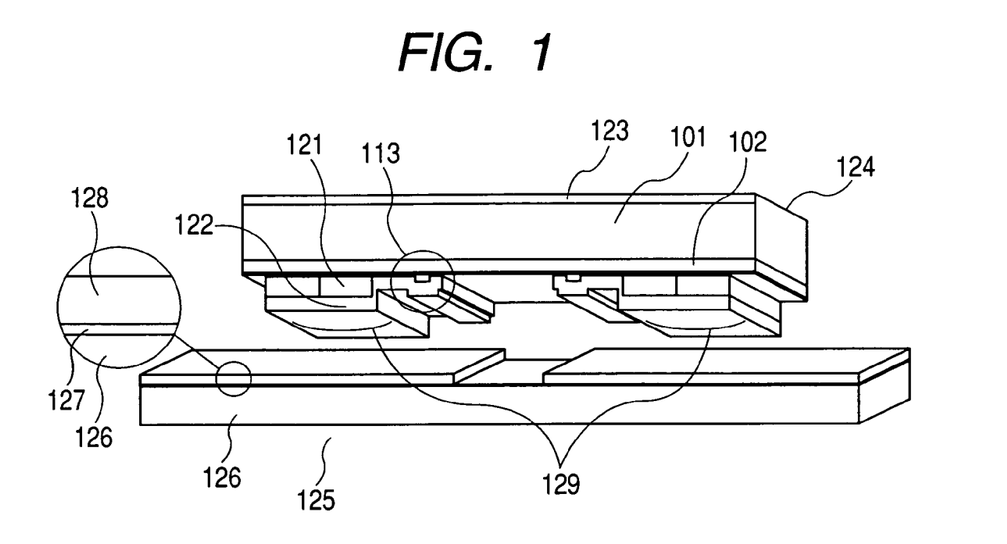
FIG. 1 shows a mounted-state of a laser chip and a submount of a first embodiment.

If the distance from the region to be fixed on the submount by soldering it to the stripe waveguide 113 is 10 μm or less, the heat to be dissipated through the electrodes is so sufficient as to satisfy the characteristics as the printer array laser. At this time, the regions 129 fixed on the submount by soldering them, as shown in FIG. 1, are formed to have the stress absorbing layers 121 for absorbing the stress to be generated due to the thermal expansion coefficient difference between the submount 125 and the laser chip 124, so that the stripe waveguide 113 can be prevented from being influenced by the stress, deteriorated in the reliability or adversely affected by the dispersion of the wavelength.

Those stress absorbing layers 121 can be prepared by forming the gold-plated layer selectively to form the gaps 120 in the metal electrode, or by using a highly plastic metal layer such as the In 202 or a highly plastic organic member such as the resist layer 301 between the metal electrode of the stationary portion and the semiconductor layer.

The electrodes across the stress absorbing layers 121 are shaped to bulge higher than the peripheral region of the stripe waveguide 113, and only those regions become the regions 129 to be selectively fixed on the submount at the soldering time. It is, therefore, to suppress the dispersion of the stress of the stripe waveguide 113 due to the assembling dislocation, thereby manufacturing elements having regular characteristics.

This stress-absorbing layer 121 is harder to transfer the heat than a highly conductive material such as gold. According to this structure, however, the main heat conduction passage is a shorter transverse heat conduction through the electrodes 116. As a result, the quantity of heat to escape from the region 129 fixed on the submount by soldering it to the submount 125 through the stress-absorbing layer 121 is so small that no large deterioration occurs in heat radiation. The specific modes of embodiments of the invention are described in the following.

FIRST EMBODIMENT

The first embodiment manufactures an array-type semiconductor laser apparatus, as shown in FIG. 1, which supports a semiconductor laser chip 124 having two independently drivable stripe waveguides 113 in a common chip and which is soldered to a submount 125 having a function to dissipate the heat generated in the laser chip.

Figure 2:
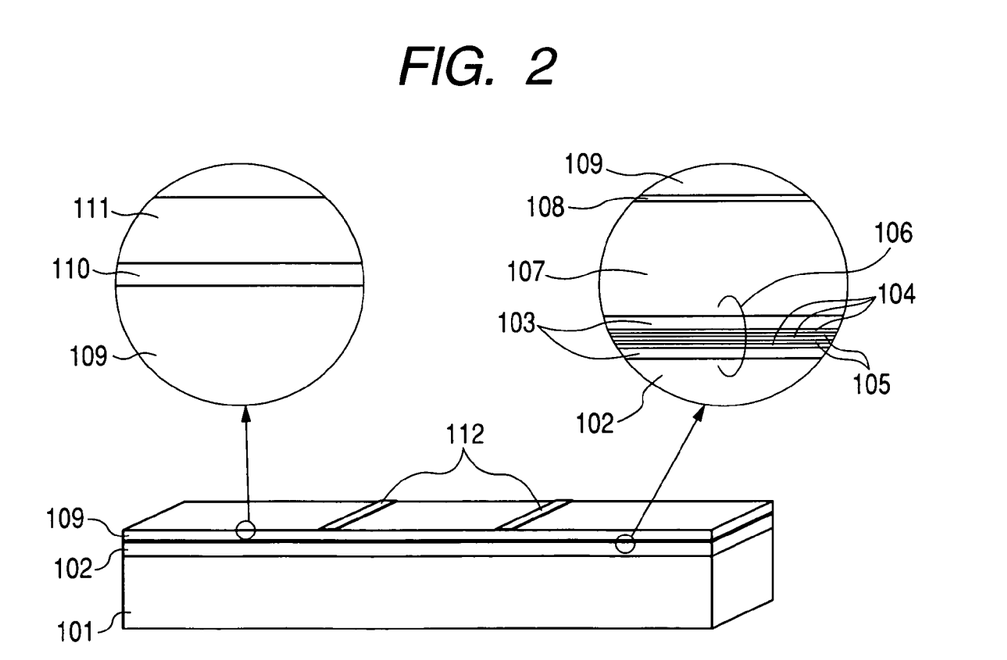
FIG. 2 shows a semiconductor laser crystal structure of the first embodiment.

This structure is made at first, as shown in FIG. 2, by laminating, by a metal organic chemical vapor deposition method on an n-type GaAs ($n=1 \times 10^{18}$ $cm^{-3}$) substrate 101 off by 10 degrees in a direction [011] from a plane (100): an n-type $(Al_{0.7}Ga_{0.3})_{0.5}In_{0.5}P$ ($n=1 \times 10^{18}$ $cm^{-3}$) cladding layer 102 having a thickness of 1.8 μm; a multiple quantum well active layer 106 having a well number 3 and composed of a $(Al_{0.5}Ga_{0.5})_{0.5}In_{0.5}$) P-light confinement layer (non-dope) 103, a strained quantum well layer (non-doped) 104 having a thickness of 5 nm, and a $(Al_{0.5}Ga_{0.5})_{0.5}In_{0.5}$) barrier layer (non-dope) 105 having a thickness of 5 nm; a p-type first cladding layer 107 made of p-type $(Al_{0.7}Ga_{0.3})_{0.5}In_{0.5}P$ ($p=7 \times 10^{17}$ $cm^{-3}$) and having a thickness of 0.08 μm; a p-type etching stop layer 108 made of p-type $Ga_{0.5}In_{0.5}P$ ($p=7 \times 10^{17}$ $cm^{-3}$) and having a thickness of 5 nm; a p-type second cladding layer 109 made of an $(Al_{0.7}Ga_{0.3})_{0.5}In_{0.5}P$ ($p=7 \times 10^{17}$ $cm^{-3}$) and having a thickness of 1.2 μm; a p-type oxidation-retarding layer 110 made of p-type $Ga_{0.5}In_{0.5}P$ ($p=7 \times 10^{17}$ $cm^{-3}$) and having a thickness of 0.01 μm; and a p-GaAs cap layer ($p=3 \times 10^{18}$ $cm^{-3}$) 111 having a thickness of 4 μm, thereby forming a double hetero-structure.

Next, a $SiO_2$ film of a thickness of 200 nm is deposited on the double hetero-substrate by a thermal CVD method. After this, by the photolithography technology, the $SiO_2$ film is formed into a stripe shape having a longitudinal direction in the [01(-1)] direction, thereby forming a $SiO_2$ film 112. Herein, the [011] direction and the [01 (-1)] direction are different from each other by 90 degrees. The $SiO_2$ protecting film 112 has a stripe shape of a width of 2 microns arranged at an interval of about 30 μm, and is repeatedly formed in a pair of two over the wafer at an interval equal to the width of the laser chip.

Figure 3:
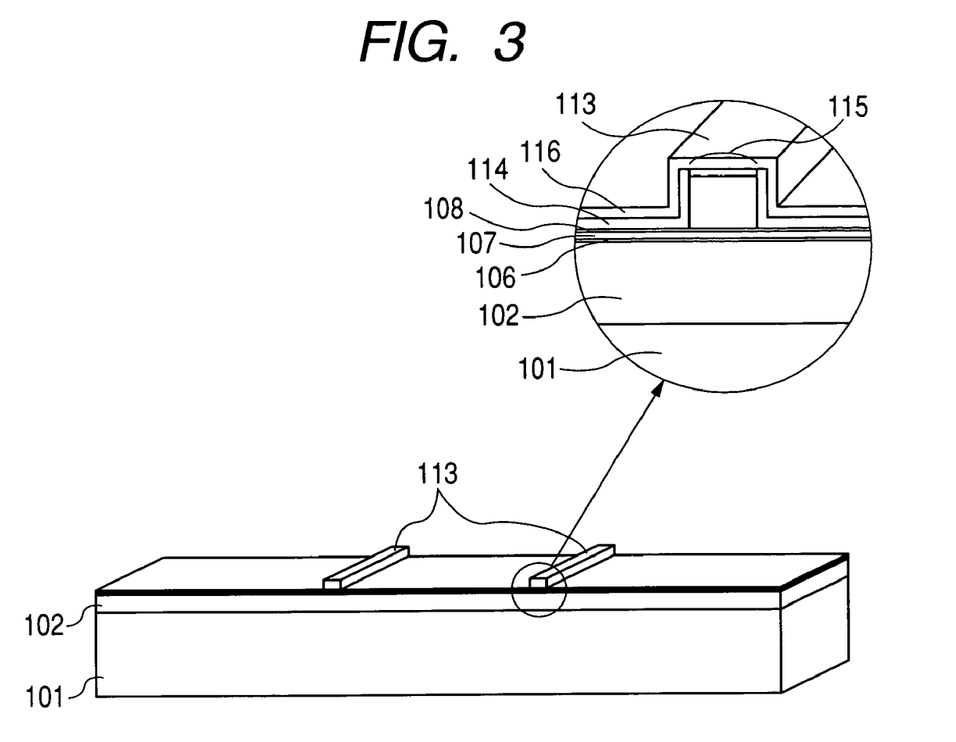
FIG. 3 shows a state where a ridge-shaped waveguide structure is formed in the semiconductor laser crystal of the first embodiment.

Next, by executing the following working process, that wafer is formed into a structure shown in FIG. 3. At first, by using the aforementioned stripe $SiO_2$ protecting film 112 (as shown in FIG. 2) as a mask, a dry etching or a reactive ion etching is performed to such a position as to leave the p-type second cladding layer 109 of about 0.05 μm over the etching stop layer 108. The layer left over the etching stop layer is removed by a wet etching, to form the stripe waveguide structures 113 having a ridge-shaped sectional shape.

After the $SiO_2$ protecting film 112 left over the ridge was removed, a plasma CVD method is used to form a $SiO_2$ film 114 all over the surface. In this embodiment, the film thickness of the $SiO_2$ film 114 is made to or less than 250 nm. This embodiment may use another insulating film other than the $SiO_2$ film. The $SiO_2$ film 114 has, over the stripe waveguide structures 113, the opening 115, in which the p-GaAs contact layer 111 contacts a p-side electrode 116 formed over the $SiO_2$ film 114. The p-side electrode 116 is formed by depositing a Ti (titanium) evaporated electrode (although not shown) and an Au (gold) evaporated electrode (although not shown) sequentially in the recited order by using an EB evaporation method. In this embodiment, a barrier metal layer may also be formed between the Ti evaporated electrode and the Au evaporated electrode by using Pt (platinum).

Figure 4:
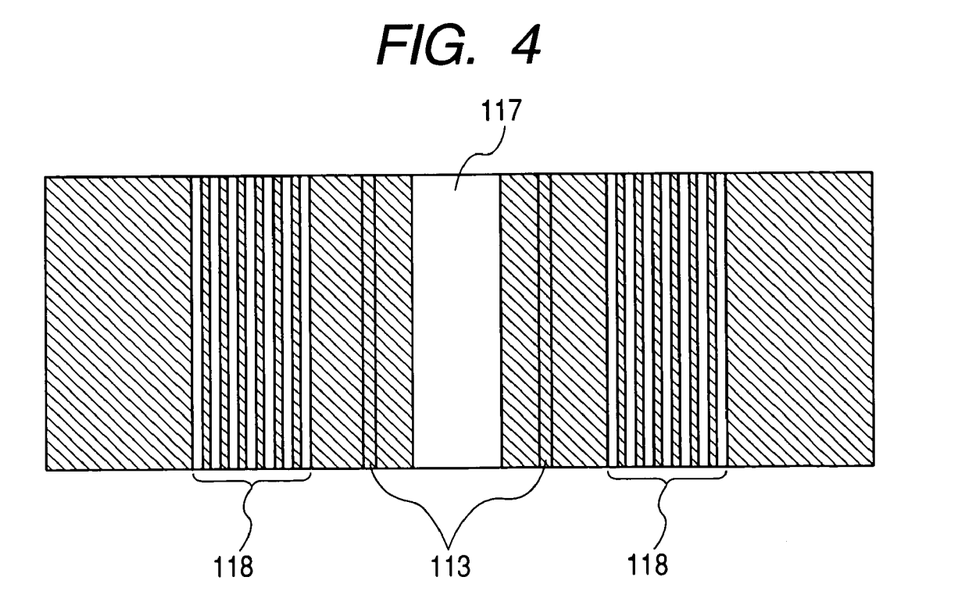
FIG. 4 shows a pattern formed on the p-side electrode of the first embodiment.

The p-side electrode 116 of the structure thus made is formed into the shape, as shown in FIG. 4, by using the photolithography technology and an ion milling technology.

As shown in FIG. 4, the p-side electrode 116 has such a region (or an electrode separating region 117) between the two stripe waveguide structures 113 as is cleared of the electrode having a width of 15 μm, and such stripe electrode regions 118 on the two sides of the stripe waveguide structure 113 that the p-side electrode 116 is formed into a stripe shape having a width of 2 microns.

Next, a thick gold electrode is formed over the p-side electrode 116 of that shape by using an electrolytic plating technology. At first, first gold-plated electrodes 119 are formed by using the electrolytic plating technology over a resist covering the region including the ridge-shaped waveguide and having a width of 50 μm. At this time, the gold is not deposited on the portion, from which the p-side electrode 116 is eliminated, but the gold deposited on the remaining portion of the electrode extends transversely, too, in the stripe electrode regions 118 so that it is combined with the gold deposited on the adjoining electrodes, thereby forming a shape, in which the p-side electrode 116 covers the eliminated region, excepting the gaps 120. The electrodes thus involving those gaps 120 is easily deformed, in case a stress is applied from the outside, to absorb the stress thereby functioning as stress-absorbing layers 121.

Figure 5:
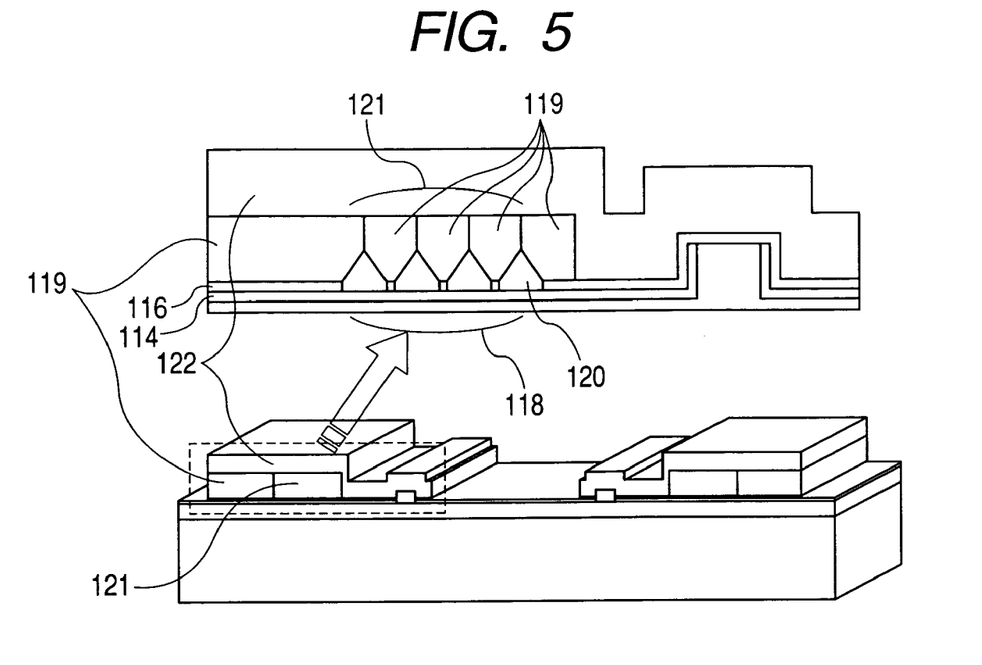
FIG. 5 shows a sectional structure of the first embodiment.

After the resist covering the stripe waveguides 113 was once eliminated, the electrode separating region 117 left between the two stripe waveguides 113 is covered with a resist, and is again formed with a second plated electrode 122 by an electrolytic plating. The first plated electrodes and the second plated electrode are made to have a film thickness of 3 μm individually. The process thus far described forms the semiconductor wafer having a sectional structure shown in FIG. 5. The semiconductor wafer thus having that laser structure formed is polished to a thickness of 100 m to form a back electrode 123, and is cleaved to a length of 300 μm in a resonator direction. The semiconductor wafer is divided to a width of 250 μm thereby manufacturing the array type semiconductor laser chip 124.

In the submount 125 of this embodiment, on the other hand, there are formed over an aluminum nitride substrate 126 TiPtAu electrodes 127 which correspond to the electrodes of the array type semiconductor laser chip 124, and over which AuSn solder patterns 128 are formed. The array type semiconductor laser chip 124 thus manufactured is assembled with its junction face being downward on the submount, as shown in FIG. 1. At this time, the portion, in which the stress-absorbing layer is made higher at its electrode surface from the wafer face than the region around the stripe waveguides 113 by the two gold plating steps. At the soldering time, that portion acts as regions 129 to be soldered and fixed to the submount.

SECOND EMBODIMENT

In the first embodiment, the plated electrodes 119 having the gaps 120 were used at the electrolytic plating time as the stress-absorbing layers 121 for preventing the stress from the submount from being transmitted to the stripe waveguide structures 113. Similar functions can be realized not only by the plated electrodes having the gaps 120 but also by In electrodes buried in the gold electrodes, for example.

Figure 6:
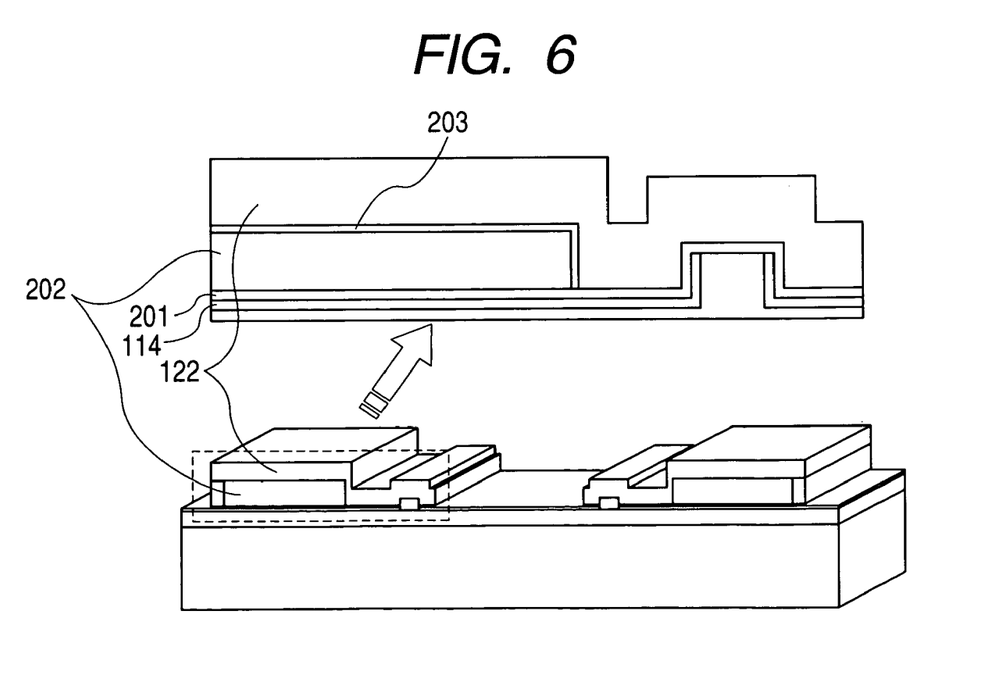
FIG. 6 shows a sectional structure of a second embodiment.

As the second embodiment, an example, in which the electrodes involving those In electrodes are used as the stress-absorbing layers 121, is described with reference to FIG. 6.

In this embodiment, too, the process up to the step of forming the stripe waveguides 113 is performed as in the first embodiment. Subsequent to this step, an EB evaporation method or the like is used to evaporate Ti (titanium) evaporated electrodes (although not shown), Pt (platinum) evaporated electrodes, Au (gold) evaporated electrodes (although not shown) and Pt (platinum) are evaporated sequentially in the recited order, thereby forming a p-side electrode 201.

Subsequently, the resist layer formed by the photolithography technology is evaporated with In by using the EB evaporation method, and the unnecessary portions are eliminated by a lift-off method, to form an In electrode 202. This In electrode 202 has a thickness of about 2 μm, and a Pt (platinum) electrode 203 is also formed thereover. The Pt (platinum) electrode 203 has a function to prevent the In electrode from being alloyed with the peripheral gold.

The gold-plated electrode 122 is formed on that structure by using an electrolytic plating method, and the p-side electrode 201 is eliminated from the regions which are not covered with the gold-plated electrode 122 and the In electrode 202, thereby forming the electrode separating region 117 for insulating the stripe waveguides 113 from each other.

The semiconductor wafer having the laser structure thus formed is polished to a thickness of 100 μm thereby forming the back electrode 123, and is cleaved to a length of 300 μm in the resonator direction. The semiconductor wafer is divided to a width of 250 μm into a laser chip.

In the submount 125 of this invention, on the other hand, there are formed over the aluminum nitride substrate 126 the TiPtAu electrodes 127 which correspond to the pattern of the semiconductor laser, and over which the AuSn solder patterns 128 are formed. The semiconductor laser chip thus manufactured is assembled with its junction face being downward on that submount.

The In electrode 202 has a higher plasticity than that of the gold electrode, and is deformed by a stress as low as about 5 MPa, so that it can absorb most of the stress generated due to the difference between the coefficients of thermal expansion between the semiconductor and the submount, thereby reducing drastically the stress to be transmitted to the stripe waveguide 113.

THIRD EMBODIMENT

Figure 7:
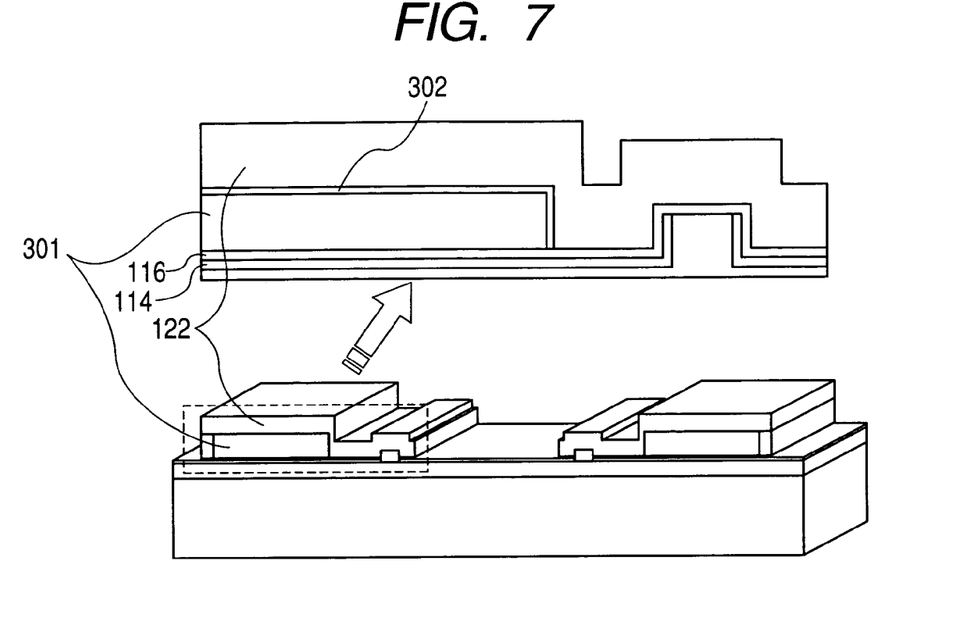
FIG. 7 shows a sectional structure of a third embodiment.

In the second embodiment, the In electrode is used as the stress-absorbing layer. However, the thermal conduction from the laser chip is mostly made through the gold plated electrode, so that the stress-absorbing layer can also be realized by a structure, in which a material other than a metal such as a photoresist is buried in the plated electrode. A structure, which is formed by this method, as shown in FIG. 7, is described as the third embodiment.

This embodiment exemplifies the example, in which an electrode involving a resist layer 301 is used as the stress-absorbing layer 121. In this embodiment, too, the process up to the step of forming the semiconductor substrate and the stripe waveguides 113 is performed as in the first embodiment.

Subsequent to this step, the EB evaporation method or the like is used to evaporate the Ti (titanium) evaporated electrodes (although not shown), the Pt (platinum) evaporated electrodes and the Au (gold) evaporated electrodes (although not shown) are evaporated sequentially in the recited order, thereby forming the p-side electrode 116. Subsequently, the photolithography method is used to the photo-resist layer 301 is formed in the shape, as shown in FIG. 7. A gold electrode 302 is evaporated on the structure, and the gold-plated electrode 122 is then formed on that structure by using the electrolytic plating method, and the p-side electrode 116 is eliminated from the regions which are not covered with the gold-plated electrode 122 and the photoresist 310, thereby forming the electrode separating region 117 for insulating the stripe waveguides 113 from each other. The semiconductor wafer having the laser structure thus formed is polished to a thickness of 100 µm thereby forming the back electrode 123, and is cleaved to a length of 300 µm in the resonator direction. After a facet coating film was formed, the semiconductor wafer is divided to a width of 250 µm into the laser chip 124.

In the submount 125 of this invention, on the other hand, there is formed over the aluminum nitride substrate 126 the TiPtAu electrodes 127 which correspond to the pattern of the semiconductor laser, and over which the AuSn solder patterns 128 are formed. The semiconductor laser chip thus manufactured is assembled with its junction face being downward on that submount. The resist layer 301 has a higher plasticity than that of the gold electrode, and is deformed by a stress as low as about 5 MPa, so that it can absorb most of the stress generated due to the difference between the coefficients of thermal expansion between the semiconductor and the submount, thereby reducing drastically the stress to be transmitted to the stripe waveguide 113.

FOURTH EMBODIMENT

The foregoing embodiments have been applied to the two-beam array having the two stripe waveguides 113. This embodiment is an example applied to a multi-element array laser of four elements. In this multi-element array, it is difficult to form a solder-junction region between the adjoining stripe waveguides 113.

Figure 8:
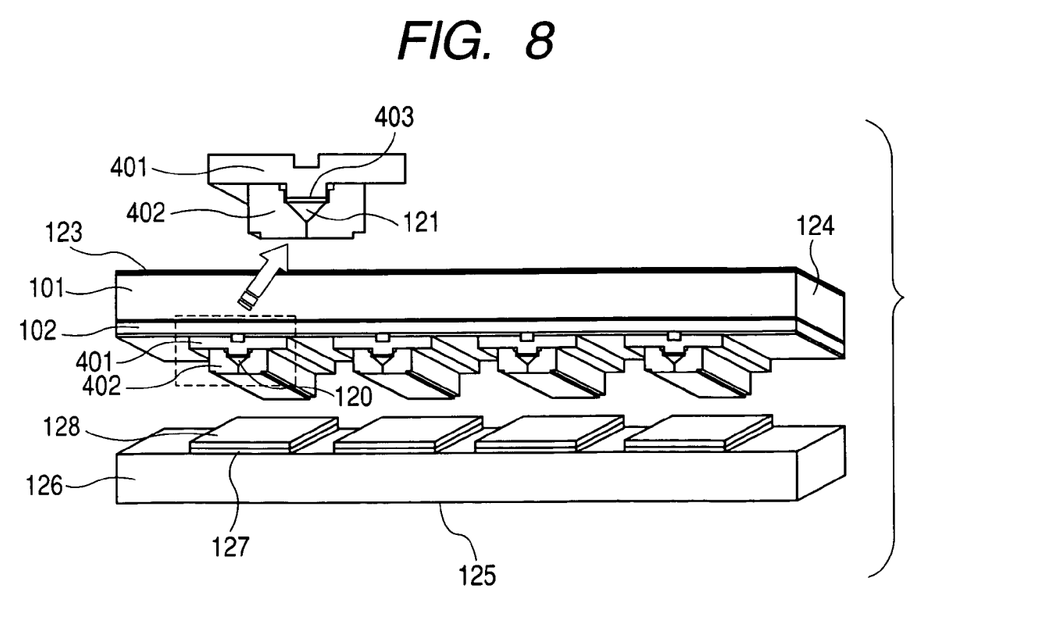
FIG. 8 shows a mounted-state of a laser chip and a submount of a fourth embodiment.

In this embodiment, the peripheral region of the stripe waveguide 113 is used as the solder-junction region having the two gold-plated layers, between which a space is formed into the stress-absorbing layer 121. In this embodiment, too, the process up to the step of forming the semiconductor substrate and a ridge-shaped waveguide is performed as in the first embodiment. However, the stripe waveguides 113 are formed at four portions on the single chip, as shown in FIG. 8.

Subsequent to this step, the EB evaporation method or the like is used to evaporate the Ti (titanium) evaporated electrodes (although not shown), the Pt (platinum) evaporated electrodes and the Au (gold) evaporated electrodes (although not shown) are evaporated sequentially in the recited order, thereby forming the p-side electrode 116.

In the periphery of 20 µm of a light emitting region, there is formed a band-shaped first plated electrode 401, over which a Ti (titanium) evaporated electrode 402. Subsequently, the CVD technology and the photolithography technology are used to form a band-shaped SiO$_2$ film 403 in the periphery of about 8 µm of the stripe waveguide 113.

If an electrolytic plating is further applied to that structure, the gold is deposited on the region other than that which is covered with the photoresist and the SiO$_2$ film, thereby forming a second gold-plated electrode 404. However, the narrow and thin SiO$_2$ film is buried in the second gold-plated electrode 404 thereby forming the dual electrode having the gaps 120 therein.

This structure is reversed from the first to the third embodiments in that the position to be fixed by the soldering operation is located in the periphery of the stripe waveguide 113. However, this embodiment and the foregoing embodiments employ the common concept in that the heat generated in the stripe waveguide 113 diffuses transversely of the gold-plated electrode layer, and in that the solder-fixed portion is not adhered directly to the semiconductor of the stripe waveguide 113 thereby forming a space for absorbing the stress.

The semiconductor laser chip 124 thus formed is assembled with its junction face being downward on that submount 125, which is made of the aluminum nitride 126 including the TiPtAu electrodes 127 and the AuSn solder patterns 128 corresponding to the four array elements, as shown in FIG. 8.

FIFTH EMBODIMENT

Figure 9:
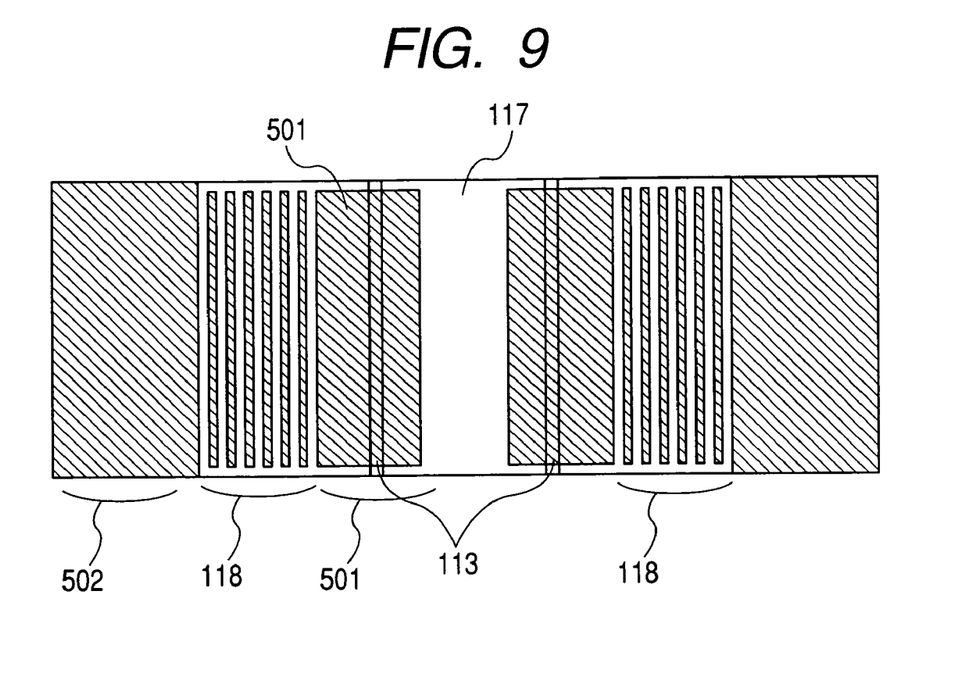
FIG. 9 shows a pattern formed on the p-side electrode of a fifth embodiment.
Figure 10:
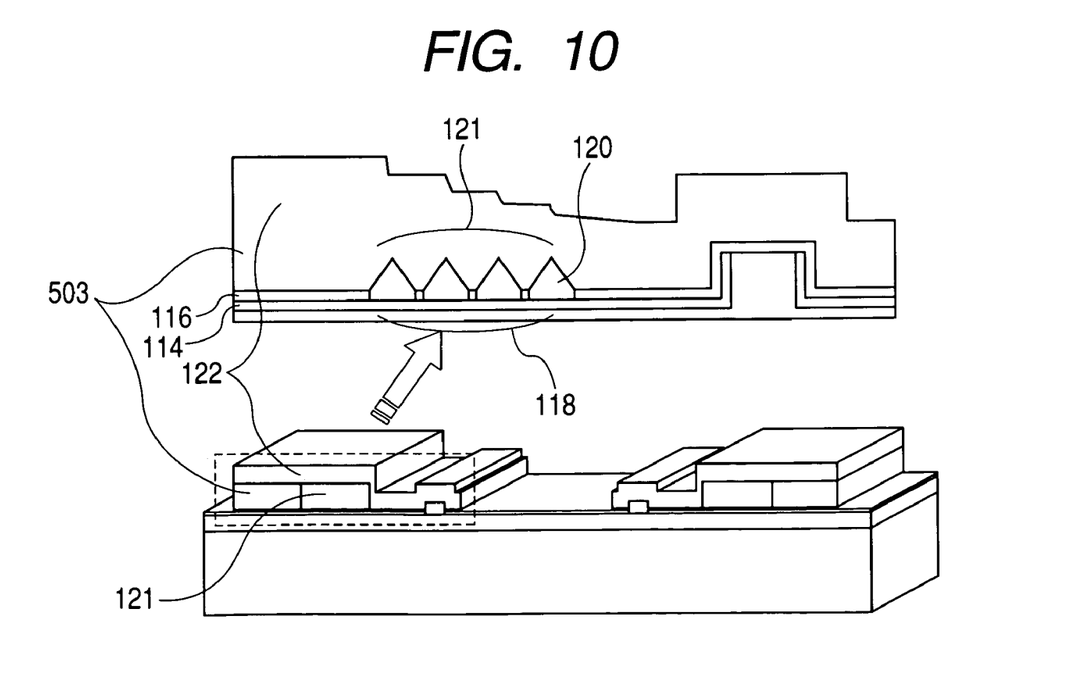
FIG. 10 shows a sectional structure of a laser of a fifth embodiment.

The first embodiment has been described on the example, in which the stress-absorbing layer for relaxing the stress and the gold electrode for dissipating the heat are separately formed. By a selective power feed at the gold plating time, however, a similar structure can also be formed by only one plating step. FIG. 9 shows the shape of the p-side electrode 116, before the gold plating, for realizing that step. This shape is substantially similar to that of the p-side electrode 116 of the first embodiment, as shown in FIG. 4. However, the shape is characterized in that the stripe electrode regions 118 and p-side electrodes 501 in the peripheries of the stripe waveguides are so separated for every chips as are not electrically connected with the adjoining chips. With this constitution, at the beginning of the gold-plating step, the electric current flows exclusively through plating feeder electrodes 502 connected electrically with the whole wafer through the adjoining chip patterns, thereby plating the same. As this plating step advances, the deposited gold contacts to plate the stripe electrode regions 118 and the p-side electrodes 501 in the peripheries of the stripe waveguides although they are electrically separated at the beginning. As a result, only the stress-absorbing layer 121 involving the gaps for relaxing the stress, as shown in FIG. 10, and the regions having dense electrodes formed thereover and the stress-absorbing structure 121 become higher than the remaining region so that the regions 129 to be fixed on the submount by soldering them can be formed by the single plating step. The semiconductor wafer having the laser structure thus formed is polished to a thickness of 100 µm thereby forming the back electrode, and is cleaved to a length of 300 µm in the resonator direction. After the facet coating film was formed, the semiconductor wafer is divided to a width of 250 µm into the laser chip 124.

In the submount 125 of this embodiment, on the other hand, the TiPtAu electrode 127 corresponding to the pattern of the semiconductor laser is formed over the aluminum nitride substrate 126, and the AuSn solder patterns 128 are formed on the TiPtAu electrode 127. The semiconductor laser chip 124 thus formed is assembled with its junction face being downward on that submount 125.

What is claimed is:
1. A semiconductor laser apparatus comprising:
  a laser device including:
    a semiconductor substrate,
    first and second resonators that are formed on the semiconductor substrate, extend in parallel with each other and are electrically separated from each other, and
    first and second electrodes that are each electrically connected with corresponding one of the first and the second resonators and extend away from each other; and
  a submount including:
    third and fourth electrodes that are electrically separated from each other and are each adhered with corresponding one of the first and the second electrodes by a solder member;
  wherein each of the first and the second electrodes includes:
    an energizing portion that covers corresponding one of the first and the second resonators, an adhering portion that is disposed separately from the energizing portion, the adhering portion having a height from a surface of the semiconductor substrate larger than that of the energizing portion, and a stress-absorbing portion that is formed in the adhering portion.

2. The semiconductor laser apparatus according to claim 1, wherein the laser device further includes an n-type cladding layer, an active layer, and a p-type cladding layer that are mounted on the semiconductor substrate.

3. The semiconductor laser apparatus according to claim 1, wherein each of the first and the second resonators includes a stripe waveguide laser resonator.

4. The semiconductor laser apparatus according to claim 1, wherein the first and the second resonators are spaced at a predetermined distance.

5. The semiconductor laser apparatus according to claim 1, wherein the third electrode is adhered with the first electrode through the adhering portion thereof; and wherein the fourth electrode is adhered with the second electrode through the adhering portion thereof.

6. The semiconductor laser apparatus according to claim 1, wherein the stress-absorbing portion includes a cavity.

7. The semiconductor laser apparatus according to claim 1, wherein the stress-absorbing portion includes an In-member.

8. The semiconductor laser apparatus according to claim 1, wherein the stress-absorbing portion includes a member having a yielding limit stress higher than 0 MPa and at or lower than 5 MPa.

9. The semiconductor laser apparatus according to claim 1, wherein the stress-absorbing portion relaxes a stress generated between the laser device and the submount caused by a thermal expansion coefficient difference therebetween when adhered.

10. The semiconductor laser apparatus according to claim 1, wherein surfaces of the energizing portions are separated from a surface of the submount.

11. The semiconductor laser apparatus according to claim 1, wherein the laser device includes a plurality of resonators disposed at a spacing from each other.

12. A method for mounting a semiconductor laser apparatus, comprising:
preparing a laser device including:
a semiconductor substrate,
first and second resonators that are formed on the semiconductor substrate, extend in parallel with each other and are electrically separated from each other, and
first and second electrodes that are each electrically connected with corresponding one of the first and the second resonators and extend away from each other;
preparing a submount including:
third and fourth electrodes that are electrically separated from each other; and
adhering the first electrode to the third electrode and the second electrode to the fourth electrode by a solder member;
wherein each of the first and the second electrodes includes:
an energizing portion that covers corresponding one of the first and the second resonators,
an adhering portion that is disposed separately from the energizing portion, the adhering portion having a height from a surface of the semiconductor substrate larger than that of the energizing portion, and
a stress-absorbing portion that is formed in the adhering portion.

* * * * *